(12) United States Patent
Chow

(10) Patent No.: US 11,867,720 B2
(45) Date of Patent: Jan. 9, 2024

(54) TEST SYSTEM CONFIGURATION ADAPTER SYSTEMS AND METHODS

(71) Applicant: Advantest Corporation, Tokyo (JP)

(72) Inventor: Eddy Wayne Chow, San Jose, CA (US)

(73) Assignee: Advantest Corporation, Tokyo (JP)

( * ) Notice: Subject to any disclaimer, the term of this patent is extended or adjusted under 35 U.S.C. 154(b) by 288 days.

(21) Appl. No.: 17/099,610

(22) Filed: Nov. 16, 2020

(65) Prior Publication Data
US 2022/0155342 A1    May 19, 2022

(51) Int. Cl.
*G01R 1/04* (2006.01)
*G01R 31/319* (2006.01)
*G01R 31/3185* (2006.01)

(52) U.S. Cl.
CPC ..... *G01R 1/0441* (2013.01); *G01R 31/31905* (2013.01); *G01R 31/318519* (2013.01)

(58) Field of Classification Search
None
See application file for complete search history.

(56) References Cited

U.S. PATENT DOCUMENTS

| | | | | |
|---|---|---|---|---|
| 6,862,705 | B1 * | 3/2005 | Nesbitt | G01R 31/31723 714/729 |
| 11,320,480 | B1 * | 5/2022 | Gaoiran | G01R 31/2849 |
| 11,334,459 | B2 * | 5/2022 | Bautista | G01R 31/31716 |
| 2003/0208713 | A1 * | 11/2003 | Evans | G01R 31/31903 714/742 |
| 2014/0253099 | A1 * | 9/2014 | Han | G01R 19/00 324/126 |
| 2016/0109485 | A1 * | 4/2016 | Haefner | G01R 31/2834 324/750.03 |
| 2018/0267101 | A1 | 9/2018 | Champoux et al. | |
| 2020/0200819 | A1 | 6/2020 | Malisic et al. | |
| 2021/0302469 | A1 * | 9/2021 | Su | G01R 1/0416 |
| 2022/0058097 | A1 * | 2/2022 | Bautista | G06F 11/2268 |

FOREIGN PATENT DOCUMENTS

| | | | |
|---|---|---|---|
| CN | 108802519 A | 11/2018 | |
| CN | 110908849 A | 3/2020 | |
| CN | 114509615 A * | 5/2022 | ........... G01R 1/0441 |
| TW | 201413267 A | 4/2014 | |
| TW | 201907174 A | 2/2019 | |

* cited by examiner

*Primary Examiner* — Jermele M Hollington

(57) ABSTRACT

Presented embodiments facilitate efficient and effective flexible implementation of different types of testing procedures in a test system. In one embodiment, a test system configuration adapter includes a tester side socket, a break out pin, and a device under test (DUT) side slot. The tester side socket is configured to couple with a test equipment socket. The break out pin is configured to couple with the supplemental equipment. The DUT side slot is configured to couple with the tester side socket, the break out pin, and a DUT. The test system configuration adapter is configured to enable communication between test equipment coupled to the test equipment socket and supplemental equipment coupled to the breakout pin while the DUT remains coupled to the DUT side slot. The breakout pin and tester side socket can be selectively coupled to the DUT side slot.

17 Claims, 8 Drawing Sheets

600

---

610
Selecting a first type of procedure.

620
Performing the first type of procedure on devices under test in the test system.

630
Selecting a second type of procedure.

640
Performing the second type of procedures on the devices under test in the same test system.

FIG 6

TEST SYSTEM CONFIGURATION ADAPTER SYSTEMS AND METHODS

FIELD OF THE INVENTION

The present invention relates to the field of electronic testing.

BACKGROUND OF THE INVENTION

Electronic systems and devices have made a significant contribution towards the advancement of modern society and have facilitated increased productivity and reduced costs in analyzing and communicating information in a variety of business, science, education, and entertainment applications. These electronic systems and devices are typically tested to ensure proper operation. While testing of the systems and devices has made significant advances, traditional approaches are typically expensive and often have limitations with regards to throughput and convenience.

Devices under test (DUTs) are often complex and require different types of complicated testing procedures to achieve reliable results. Usually, testing is directed to determining if a device under test is performing and functioning properly. In addition, many other types of supplemental operations are often helpful and desirable during testing. The supplemental operations can include additional information gathering, device under test configuration operations, and so on.

Conventional testing approaches typically require respective different separate systems to perform the functional testing and supplemental operations. The DUTs are loaded on the separate/dedicated supplemental equipment, a supplemental operation is performed, and then the DUTs are removed from the separate supplemental equipment and loaded on different separate functional testers for the functional testing. If additional supplemental operations are desired, the DUTs often have to be moved back and forth again between the functional testers and the separate supplemental equipment. A lot of testing related costs are incurred in the loading/unloading of DUTs into the separate supplemental equipment and functional testers.

Conventional testing systems typically include a large controlled environmental chamber with racks that contain devices under test (DUTs) in a number of loadboard trays. The loadboard trays are manually populated with devices under test, inserted into the environmental chamber and manually connected to the tester electronics. This process can be labor intensive and cumbersome. An entire tray usually has to be manually removed first before devices under test can be added or removed.

Conventional systems are not typically efficient with respect to multiple different types of testing and supplemental operations because: 1) the separate different systems are expensive to build and operate; and 2) physical manipulation (e.g., insertion, removal, etc.) of the devices under test between the separate test systems is labor intensive. The amount of work is considerable because the loadboards typically need to be manually removed from the environmental chamber and changed, manually populated with the numerous devices under test, and then manually recoupled to the tester slice. The conventional test head and oven enclosure access restrictions and typical hardwired nature of the test slice and loadboard coupling all add to the difficulty of the task.

Other aspects of conventional test approaches also often adversely impact productivity and throughput. In order to physically move devices under test from one separate test system to another, the entire conventional tester systems (e.g., test head, oven, etc.) typically need to be shut down and the environmental chamber or oven is opened (losing maintenance of environmental conditions). These cumbersome conventional device under test approaches usually interrupt testing operations of all the devices under test and do not typically allow flexible or continued testing of some devices while other devices are physically manipulated. There is a long felt need for a less expensive and convenient production electronic device testing and supplemental operation approach due to costs and difficulties associated traditional approaches to performing different types of testing (e.g., supplemental operations, functional testing, performance testing, etc.).

SUMMARY

Presented embodiments facilitate efficient and effective flexible implementation of different types of testing procedures in a test system. In one embodiment, a test system configuration adapter includes a tester side socket, a break out pin, and a device under test side slot. The tester side socket is configured to couple with a test equipment socket. The break out pin is configured to couple with the supplemental equipment. The device under test side slot is configured to couple with the tester side socket, the break out pin, and a device under test. The test system configuration adapter is configured to enable communication between the device under test and the test equipment coupled to the test equipment socket and supplemental equipment coupled to the breakout pin, and the device under test remains coupled to the device under test side slot during the communication. In one exemplary implementation, the breakout pin and tester side socket are selectively coupled to the device under test side slot. The test system configuration adapter can include a switch configured to switch a portion of the coupling of the device under test side slot to the tester side socket and the break out pin. The test system configuration adapter can also include a controller configured to direct the switch and selection of coupling between the supplemental operations and the functional testing for the DUT, wherein the controller is dedicated to directing selection for the DUT. The functional test can include scan testing. In one embodiment, the supplemental equipment is included in the test equipment. The supplemental operations can be performed on the device under test during pauses in the functional testing from the device under test perspective.

In one embodiment, a testing method includes selecting and performing a first type of procedure on a device under test, selecting and performing a second type of procedure on the device under test, wherein the device under test remains coupled to a test system throughout the respective, selecting a first type of testing procedure, the performing the first type of testing procedure, the selecting a second type of testing, and the performing the second type of testing procedure. The first type of procedure can be a functional test and the second type of procedure can be a supplemental operation. In one embodiment, a first device under test can be selectively decoupled from the test system during selecting a first type of testing procedure, the performing the first type of testing procedure, the selecting a second type of testing, and the performing the second type of testing procedure for a second device under test.

In one embodiment, a device under test remains coupled to a test system throughout the respective, selecting a first type of testing procedure, the performing the first type of testing procedure, the selecting a second type of testing, and the performing the second type of testing procedure for that device under test and can be selectively removed during these activities on other devices under test. The supplemental operations can be performed during pauses in the functional testing from the device under test perspective. Selecting the first type of procedure, performing the first type of procedure, selecting the second type of procedure, and performing the second type of procedure can be automatic. In one exemplary implementation, selecting the first type of procedure and selecting the second type of procedure is based upon a respective selection trigger. Selecting a first type of procedure, performing the first type of procedure, selecting a second type of procedure, and performing the second type of testing procedure can be performed iteratively.

In one embodiment, the test method includes switching to another device under test. The other device under test can remain coupled to the test system throughout the respective, selecting a first type of testing procedure for the other device under test, the performing the first type of testing procedure on the other device under test, the selecting a second type of testing for the other device under test, and the performing the second type of testing procedure on the other device under test. In one exemplary implementation, multiple devices under test can remain coupled to the test system throughout the respective, selecting a first type of testing procedure, performing the first type of testing procedure, selecting a second type of testing, and performing the second type of testing procedure. The primary functional test can include scan test procedures utilizing automatic test pattern generation (ATPG) sequences.

DESCRIPTION OF THE DRAWINGS

The accompanying drawings, which are incorporated in and form a part of this specification, are included for exemplary illustration of the principles of the present invention and not intended to limit the present invention to the particular implementations illustrated therein. The drawings are not to scale unless otherwise specifically indicated.

FIG. 6 is a block diagram of testing method in accordance with one embodiment.

DETAILED DESCRIPTION

Figure 1:
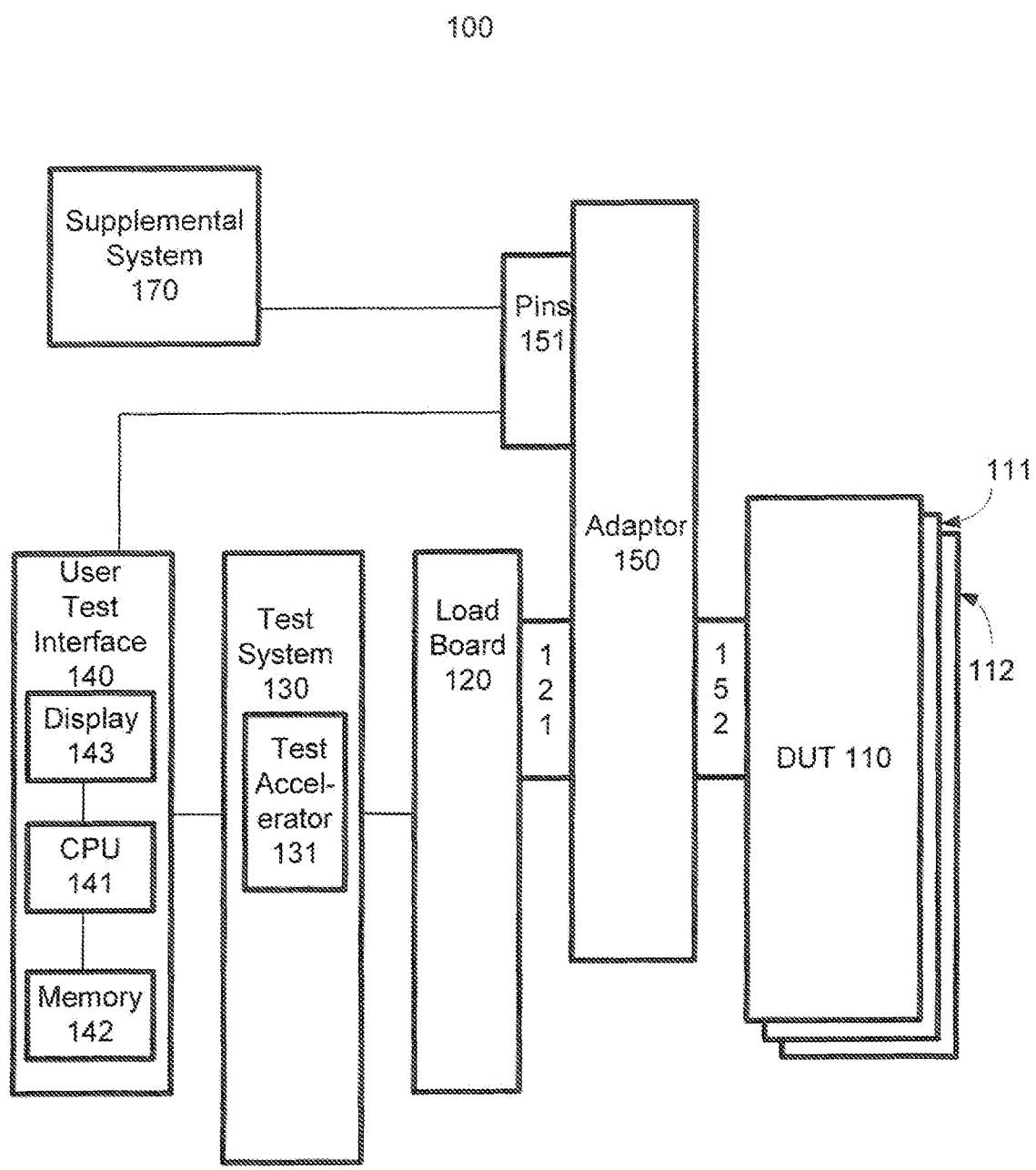
FIG. 1 is a block diagram of an exemplary test environment or system in accordance with one embodiment.

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one ordinarily skilled in the art that the present invention may be practiced without these specific details. In other instances, well known methods, procedures, components, and circuits have not been described in detail as not to unnecessarily obscure aspects of the current invention.

Presented embodiments facilitate convenient and efficient testing of electronic devices. These systems and methods pertain to a physical adapter that is coupled between a load board socket and a DUT connector. In one embodiment, the adapter can allow the DUT and the load board to communicate while breaking out certain pins and making them physically and readily available for various supplemental operations. The supplemental operations can include signal monitoring of the DUT, introduction of signals to the DUT, and so on. The monitoring can be directed to gathering information or data (e.g., zone information, name space information, etc.). In one embodiment, the adapter makes signal input/output (I/O) much easier during testing by making certain signal pins physically accessible for monitoring or for signal introduction.

In one embodiment, the adaptor can be utilized to efficiently perform operations on the fly during "gaps" or pauses in the main testing procedures without having to completely stop testing to change configurations of load boards and DUTs. The adaptor can be used to implement different priority type exchanges or transfers to the DUTs. For example, if there is a "gap" or quiet time in the main testing operations from the DUT perspective, the adapter can be used to hook up different supplemental components or machines to the DUT on the fly and perform additional operations (during the "gap"). In one exemplary implementation, the adapter enables additional "piggy backing" on existing components/pins to provide an effect similar to having extra busses or signals. In one embodiment, low level priority exchanges can occur without having to remove the DUT from a tester and hooking it up to other external supplemental or special equipment.

The adapter can facilitate some parallelism in functional testing and supplemental operations. In one embodiment, a test procedure includes a duration or time when there are no or reduced functional test operations being performed or executed on the DUT. The test operations can be considered paused from the DUT perspective. Operations related to testing (e.g., processing results from the DUT, generating new/additional test instructions/patterns for the DUT, etc.) may continue to be performed in the tester during the pause from the DUT perspective. In one exemplary implementation, a test pattern input is provided to the DUT, the DUT performs functional testing operations related to the test pattern, the DUT forwards the results to the tester and stops or pauses operations on the DUT while the tester analyzes the results and prepares additional test patterns. Supplemental operations can be performed via the break out pins during the pause. The sequencing and execution of the supplemental operations can be substantially coincident or parallel with the analyzing and preparation of additional test patterns on the tester. The switching from primary functional testing to supplemental operations can be coordinated to occur when primary functional testing is not being performed from the DUT's perspective. In one exemplary implementation, artificial intelligence can be utilized to help identify pauses in the primary functional testing and direct implementation of supplemental operations.

FIG. 1 is a block diagram of an exemplary test environment or system 100 in accordance with one embodiment. The test environment or system 100 includes devices under test (e.g., 110, 111, 112, etc.), test system configuration adapter 150, loadboard 120, test system 130, user test interface 140, and supplemental system 170. The devices under test (e.g., 110, 111, 112, etc.) are coupled to the test system configuration adapter 150, which is coupled to test board or load board 120, which is coupled to test system 130, which in turn is coupled to the user interface 140. Test system configuration adapter 150 is also coupled to supplemental system 170. User test interface 140 includes CPU 241, memory 142, and display 143. In one embodiment, the test system 130 comprises a Field Programmable Gate Array (FPGA) component that includes a test accelerator 131. The FPGA is configured to perform preliminary analysis of persistent test information. Loadboard 120 is configured to electrically and physically couple a device under test to the test system via adapter 150.

In one embodiment, the test system configuration adapter 150 includes tester side socket 121, break out pins 151, and DUT side slot 152. Configuration adapter 150 can be coupled to test board or load board 120 via tester side socket 121. Configuration adapter 150 can be coupled to supplemental system 170 via break out pins 151. Configuration adapter 150 can be coupled to DUT via DUT side slots 152.

The conversion from primary functional testing to supplemental operations can be automatic. In one embodiment, when results of primary functional testing operations meet a particular trigger or threshold (e.g., pause of particular length or duration, testing activity below a particular level of activity, particular type of test activities, etc.) the system can automatically setup and begin supplemental operations. It is appreciated the supplemental systems for directing supplemental operations can include various configurations and components (e.g., external equipment, computers, networks, cloud, artificial intelligence features, external host controller, etc.). In one exemplary implementation, the break out pins can be coupled to the tester and supplemental operations can be directed by features or components in the tester (e.g., host computer sideband FPGA controller, etc.).

In one embodiment, supplemental operations capabilities (e.g., information gathering, DUT configuration, etc.) and functional testing capabilities are added to a tester. In one exemplary implementation, the test system configuration adapter can include a switch that operates to select between a supplemental operations mode and a functional test mode. The switch is communicatively coupled to devices under test. Access to control and test information can be provided to the user via a common interface.

Figure 2:
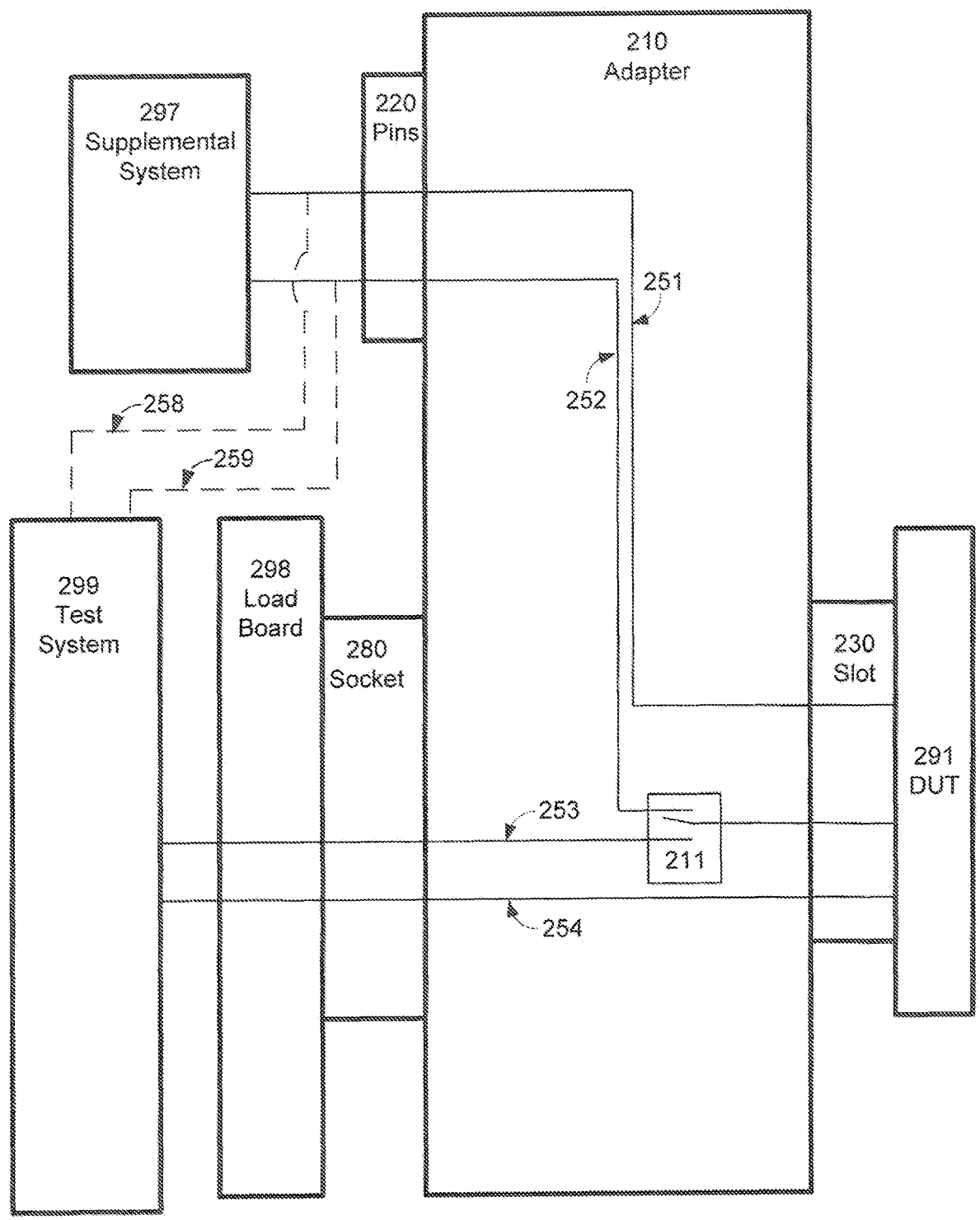
FIG. 2 is a block diagram of exemplary testing system in accordance with one embodiment.

FIG. 2 is a block diagram of exemplary testing system 200 in accordance with one embodiment. In one embodiment, test system 200 is similar to test system 100. Testing system 200 includes test system configuration adapter 210 that is communicatively coupled to devices under test 291. Configuration adapter 210 includes tester side socket 280, break out pins 220, device under test side slots 230. The tester side socket 280 is configured to couple with a test equipment socket (not shown) on load board 298. Break out pins 220 are configured to couple with the supplemental equipment 297. Device under test side slot 230 is configured to couple with the break out pins 220, tester side socket 230, devices under test 291, and portions of paths 251, 252, 253, and 254. In one embodiment, the slots can have a similar form factor to sockets.

The test system configuration adapter is configured to enable communication between a device under test and test equipment coupled to the test equipment socket and supplemental system coupled to the breakout pins while the device under test remains coupled to the device under test side slot. Supplemental operations can be implemented via paths 251 and 252 and primary functional testing can be implemented via paths 253 and 253. In one embodiment, test system configuration adapter 210 includes switch 211. Switch 211 can switch between paths 252 and 253, selectively allowing supplemental operation signal or primary functional testing signal communication with DUT 291. Path 254 can couple device under test slot 230 to tester side socket 280. In one embodiment, test system configuration adapter 210 can be coupled to test system 299 in addition to or instead of supplemental system 297 via paths 258 and 259.

Figure 3:
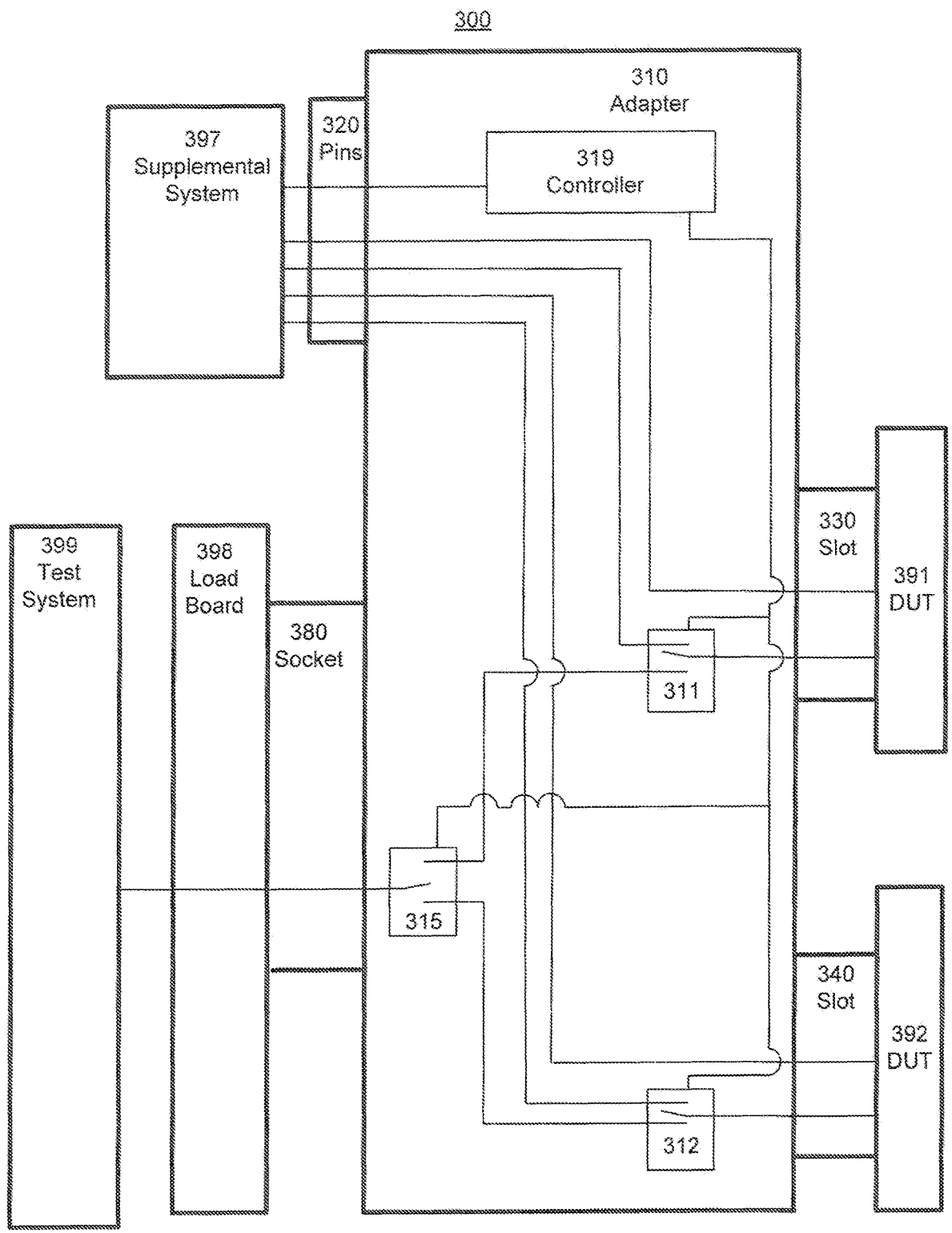
FIG. 3 is a block diagram of exemplary testing system in accordance with one embodiment.

It is appreciated that multiple DUTs can be coupled to a test system configuration adapter. FIG. 3 is a block diagram of exemplary testing system 300 in accordance with one embodiment. Test system 300 is similar to test system 200 except test system 300 includes an additional DUT slot for coupling with a second DUT. Testing system 300 includes test system configuration adapter 310 that is communicatively coupled to devices under test 391 and 392. Configuration adapter 310 includes tester side socket 380, break out pins 320, device under test side slots 330 and 340. The tester side socket 380 is configured to couple with a test equipment socket (not shown) on load board 398. Break out pins 320 are configured to couple with the supplemental equipment 397. Device under test side slots 330 and 340 are configured to couple with the break out pins 320, tester side socket 380, and devices under test 391 and 392 respectively. The test system configuration adapter is configured to enable communication between a device under test and test equipment coupled to the test equipment socket and supplemental equipment coupled to the breakout pins while the device under test remains coupled to the device under test side slot.

In one embodiment, test system configuration adapter 310 includes switches 311, 312, and 315. Similar to switch 211, switches 311 and 312 allow the breakout pins or switch 351 to be selectively coupled to device under test side slots 330 and 340 respectively. Switch 315 selectively allows switch 311 or 312 to be coupled to tester side socket 380.

In one embodiment, test system configuration adapter 310 includes controller 319. Controller 319 can be configured to control switching operations of switches 311, 312, and 315. The controller can be implemented in various mechanisms and configurations (e.g., FPGA, microprocessor, etc.). In one embodiment, the controller can be coupled (e.g. via supplemental system 387, socket 380, etc.) to the test system 399. In one embodiment, the switching functions can be controlled by an external controller (e.g., included in the supplemental system 397, test system 399, etc.).

In order to minimize logic consumption, in one embodiment there is a single controller within the FPGA that can service selection of a mode (e.g., supplemental operations mode, primary functional test mode, etc.) for multiple DUTs. In an alternate embodiment, each DUT has a dedicated controller which can facilitate faster test time. An FPGA transceiver can have hard macros supporting supplemental operations. In one embodiment, separate supplemental operations components are dedicated to respective individual DUTs. Supplemental operations configurable parameters can include transmit/receive frequency and bit pattern.

The components of testing system 200 cooperatively operate to perform multiple types of testing and supplemental operations while DUTs remain coupled to the test system. In one embodiment, the supplemental operations mode can be automatically selected and initiated at start up. The tester operations can be automatically switched to the primary functional mode after the initial supplemental operations mode is complete. Based upon results of the functional testing and as part of a debug process, an optional user initiated or automated switch back to supplemental operations mode can be made.

Figure 4:
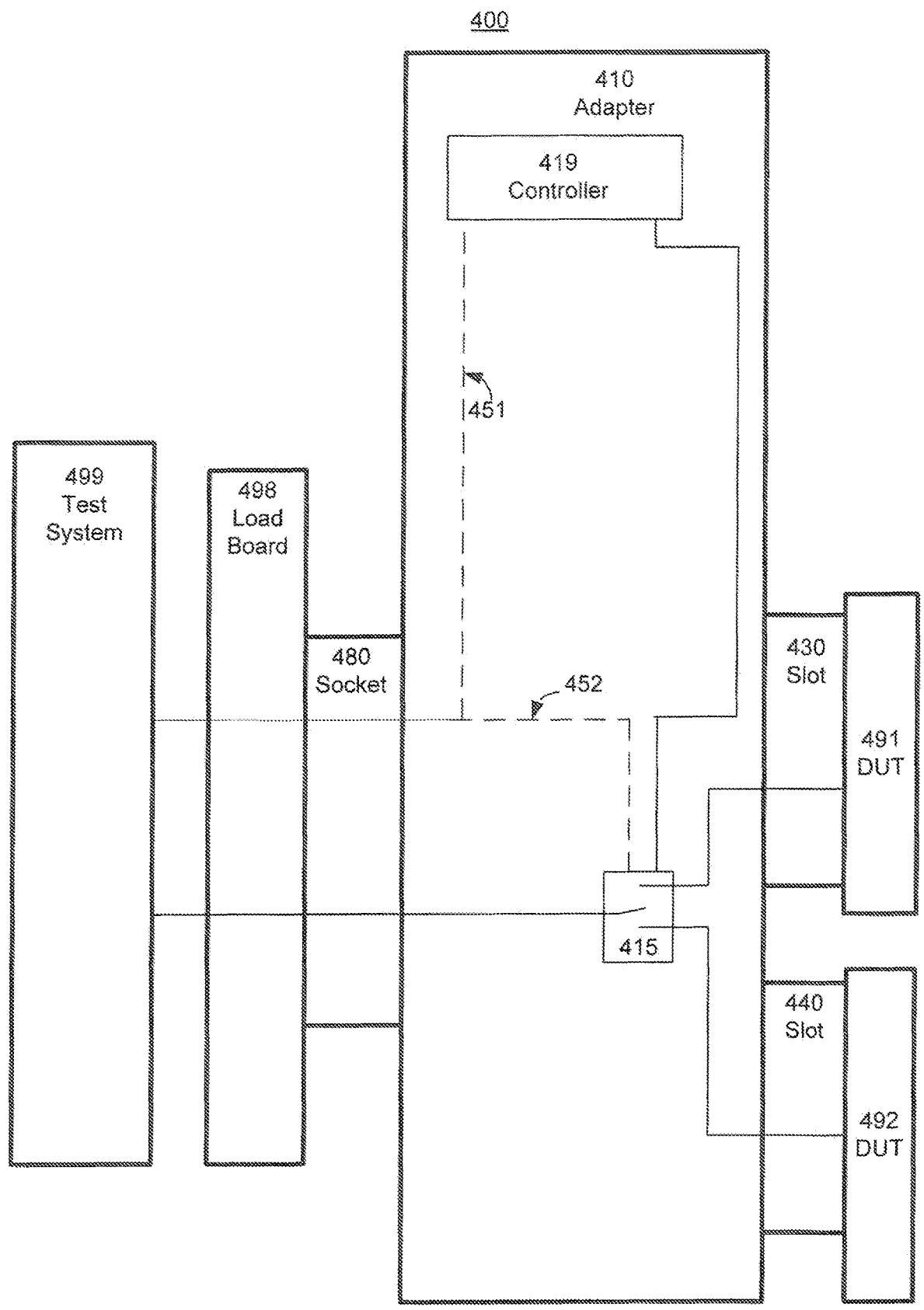
FIG. 4 is a block diagram of exemplary testing system in accordance with one embodiment.

In one embodiment, a test system configuration adapter can switch between multiple DUTs without incorporating breakout pins. FIG. 4 is a block diagram of exemplary testing system 400 in accordance with one embodiment. Testing system 400 includes test system configuration adapter 410 that is communicatively coupled to devices under test 491 and 492. Configuration adapter 410 includes tester side socket 480, device under test side slots 440 and 430. The tester side socket 480 is configured to couple with a test equipment socket (not shown) on load board 498. Device under test side slots 440 and 430 are configured to couple with the tester side socket 480. Device under test side slots 440 and 430 are also configured to couple with devices under test 491 and 492, respectively. The test system configuration adapter is configured to enable communication between test equipment and multiple DUTS coupled to the test equipment. In one advantageous use condition, a DUT can be tested while another DUT is manually swapped out or in, etc. This can facilitate reduction of overall test time by effectively hiding the time between swaps because DUT swaps are performed hot during testing of the other DUT.

In one embodiment, test system configuration adapter 410 includes controller 419. Controller 419 can be configured to control switching operations of switch 415. In one exemplary implementation, switch 415 can be controlled by test system 499 either directly via path 452 or via controller 419 and path 451.

Figure 5:
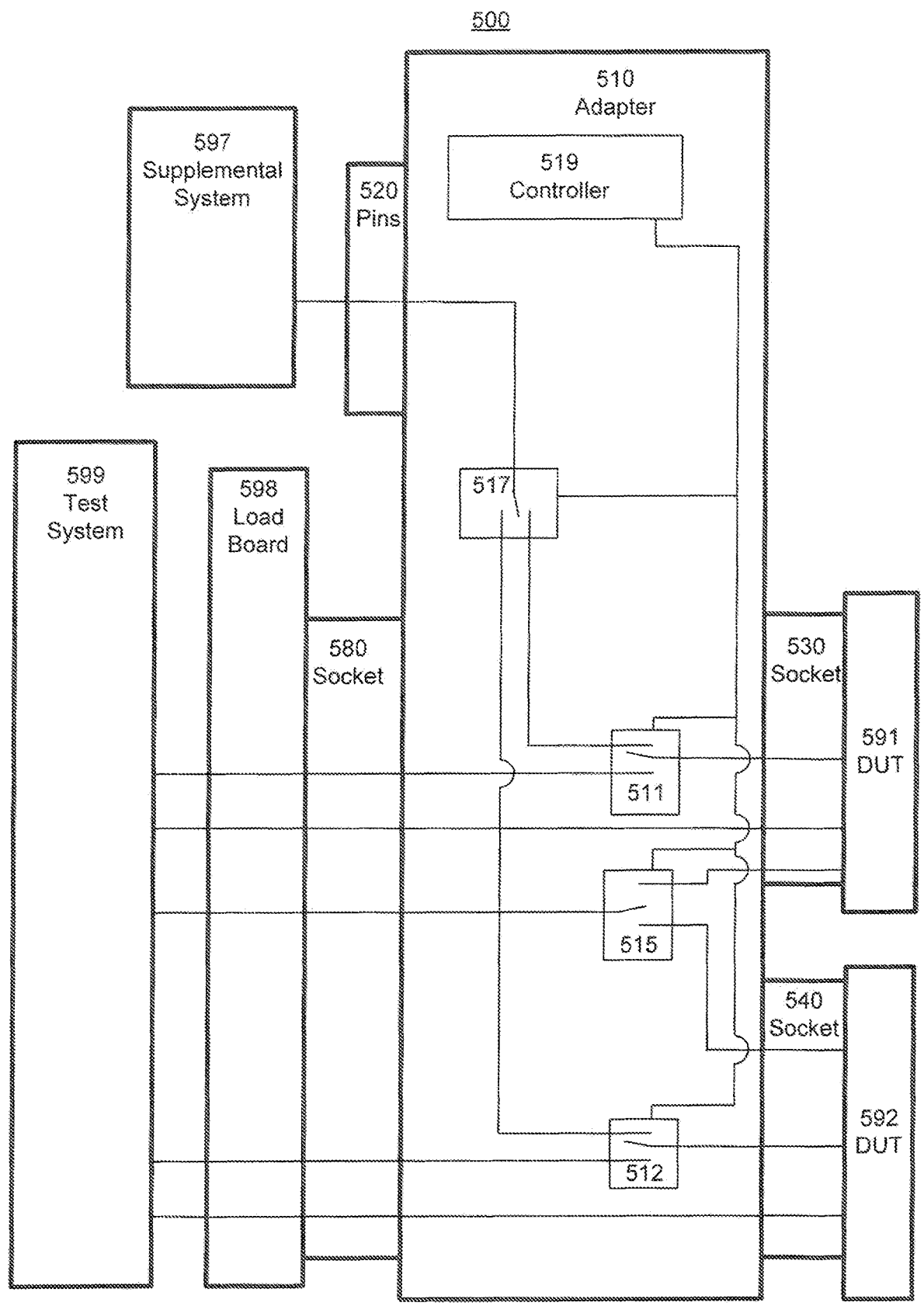
FIG. 5 is a block diagram of exemplary testing system in accordance with one embodiment.

FIG. 5 is a block diagram of exemplary testing system 500 in accordance with one embodiment. Testing system 500 includes test system configuration adapter 510 that is communicatively coupled to devices under test 591, and 592. Configuration adapter 510 includes tester side socket 580, break out pins 520, device under test side slots 550 and 530. The tester side socket 580 is configured to couple with a test equipment socket (not shown) on load board 598. Break out pins 520 are configured to couple with the supplemental equipment 597. Device under test side slots 550 and 530 are configured to couple with the break out pins 520 and tester side socket 580. Device under test side slots 550 and 530 are configured to couple with devices under test 591 and 592 respectively. The test system configuration adapter is configured to enable communication between test equipment coupled to the test equipment socket and supplemental equipment coupled to the breakout pins while the device under test remains coupled to the device under test side slot.

In one embodiment, test system configuration adapter 510 includes switches 511, 512, and 515. Similar to switches 311 and 312, switches 511 and 512 can enable respective selective switching between connection to supplemental pins 520 and tester side socket 580. Similar to switch 415, switch 515 can enable selective switching between tester side socket 580 and device under test side slot 530 and 540. Switch 517 enables selective switching between coupling breakout pins 520 to device under test side slot 530 and 540. In one exemplary implementation, test system configuration adapter 510 includes controller 519. Controller 519 can be configured to control switching operations of switches 511, 512, 515, and 517.

It is appreciated that the selective switching between breakout pins and device under test side slots, as well as selective switching between the device under test side slots and tester side socket can be accomplished by various mechanisms and configurations. The functionality of switches (311, 312, 315, 415, 511, 512, 515, 517, etc.) can be implemented in a single switch component, multiple switch components, multiplexers, crossbar switches, network switching, NVMe switch, PCIE switch, and so on.

FIG. 6 is a block diagram of an exemplary testing method in accordance with one embodiment.

In block 610 a first type of procedure is selected. The first type of procedure can include a primary functional test.

In block 620, the first type of testing procedure is performed on a device under test.

In block 630 a second type of procedure is selected. The second type of procedure can include a supplemental operation.

In block 640 the second type of testing procedure on the device under test is performed.

In one embodiment, a device under test remains coupled to a test system throughout the respective, selecting a first type of testing procedure, the performing the first type of testing procedure, the selecting a second type of testing, and the performing the second type of testing procedure. Supplemental operations can be performed during pauses in the functional testing from the device under test perspective. Selecting the first type of procedure, performing the first type of procedure, selecting the second type of procedure, and performing the second type of procedure can be automatic. In one exemplary implementation, selecting the first type of procedure and selecting the second type of procedure is based upon a respective selection trigger. Selecting a first type of procedure, performing the first type of procedure, selecting a second type of procedure, and performing the second type of testing procedure can be performed iteratively.

In one embodiment, the test method includes switching to another device under test. The other device under test can remain coupled to the test system throughout the respective, selecting a first type of testing procedure for the other device under test, performing the first type of testing procedure on the other device under test, selecting a second type of testing for the device under test, and performing the second type of testing procedure on the other device under test. In one exemplary implementation, multiple devices under test can remain coupled to the test system throughout the respective, selecting a first type of testing procedure, the performing the first type of testing procedure on, the selecting a second type of testing, and the performing the second type of testing procedure. In one exemplary implementation, one device under test (e.g., a first DUT) can be removed from the test system while another device under test (e.g., a second DUT) remains coupled to the test system throughout the respective, selecting and performing a first type of testing procedure for that device, and selecting and performing a second type of testing for the other device under test (e.g., the second DUT). The primary functional test can include scan test procedures utilizing automatic test pattern generation (ATPG) sequences.

Figure 7:
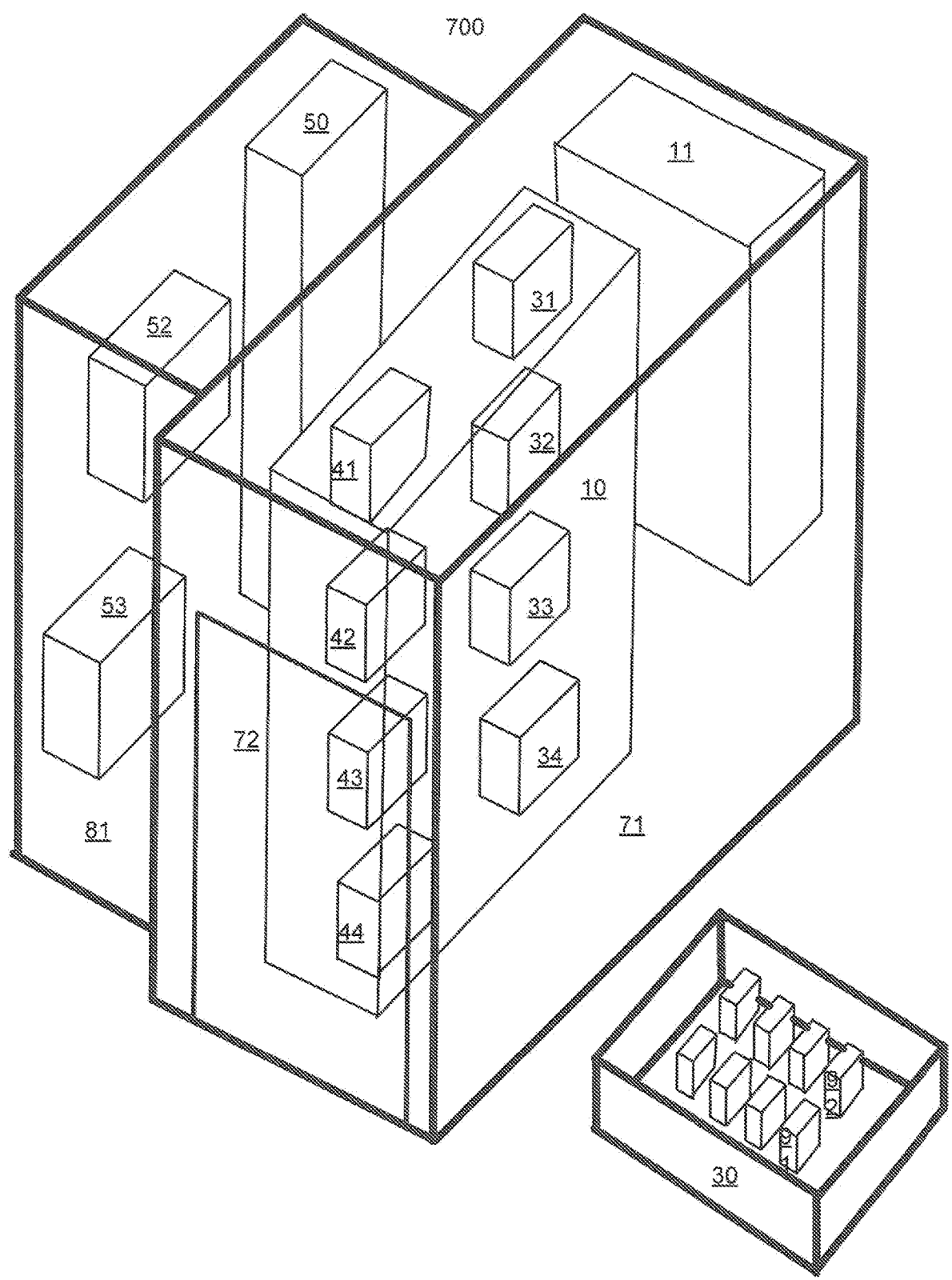
FIG. 7 is a block diagram of an exemplary testing system in accordance with one embodiment.

It is appreciated that selectable testing systems and methods can be implemented in various testing system configurations or approaches. FIG. 7 is a block diagram of an exemplary testing system in accordance with one embodiment. It consists of a large controlled environmental chamber or oven 71 that contains an oven rack 10 and heating and cooling elements 11. The oven rack 10 contains devices under test (DUTs) in a number of loadboard trays 31, 32, 33, 34, 41, 42, 43, and 44. The environmental test chamber 71 has solid walls and a solid door 72 that enclose the test rack 10. The heating and cooling elements 11 can have a wide temperature range (e.g., –10 to 120 degrees C.). The tester or test head 81 contains various racked components, including system controller network switches 52, system power supply components 53, and tester slices 50 (the tester slice contains the tester electronics). The loadboard trays (e.g., 30, 31, etc.) are connected to tester slices 50 (multiple loadboard trays can be coupled to a single tester slice). There is also a block diagram of a tester tray 30 and devices under test (e.g., 91, 92, etc.). The loadboard trays are manually populated with devices under test. The full tester trays (e.g., 30, 31, etc.) are manually inserted into environmental chamber 71 and manually connected to the tester electronics (e.g., 50, 52, 53, etc.). This process can be labor intensive and cumbersome (e.g., the process requires opening the door 72 of the environmental chamber 71 and manually trying to insert the trays though the door 72 into the appropriate location). In one embodiment, test system configuration adapters enable both supplemental operations and functional testing implementation without requiring the expensive and time-consuming multiple moves of DUTs between separate test systems, unlike conventional test approaches.

Figure 8:
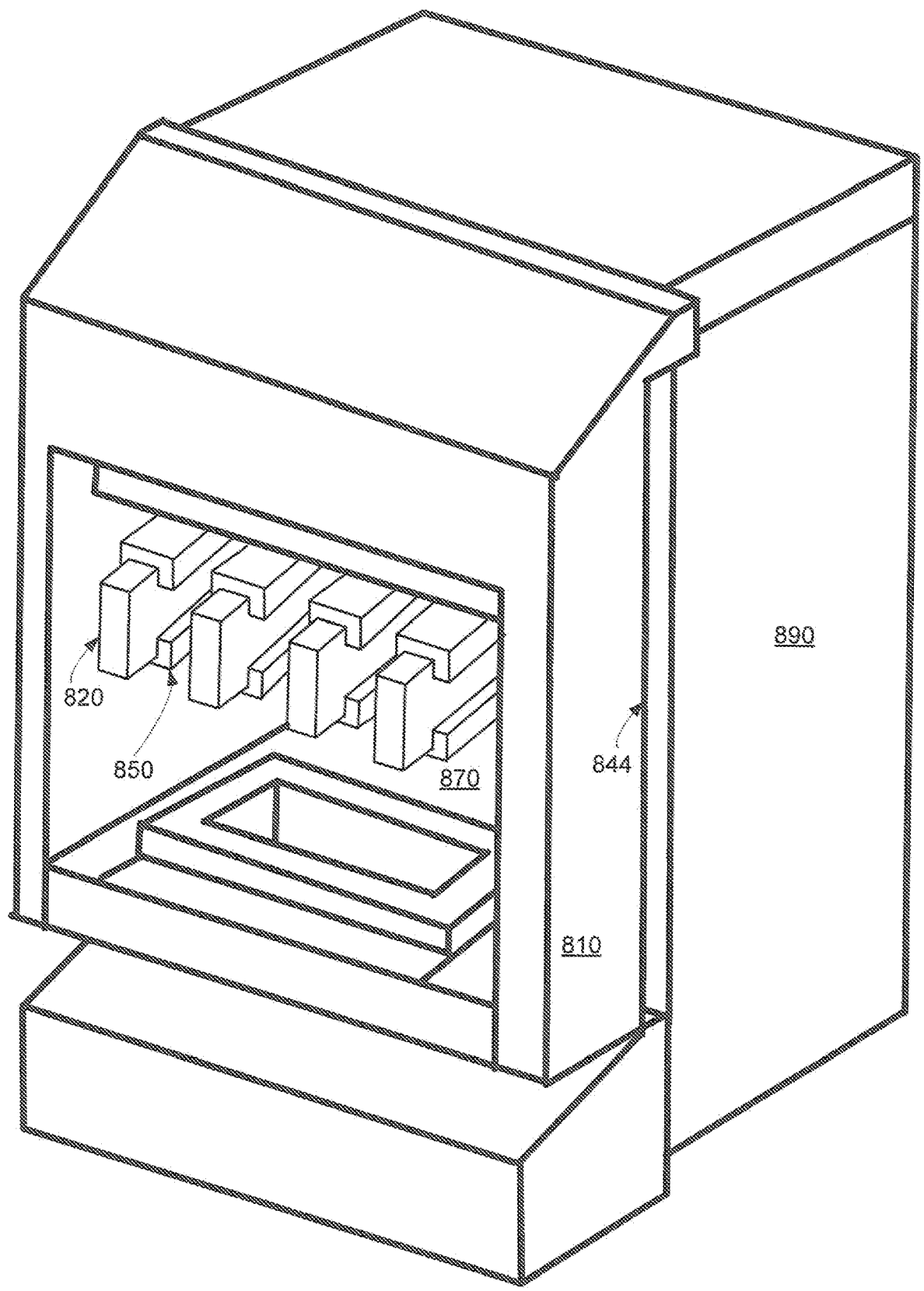
FIG. 8 is a block diagram of another exemplary test system in accordance with one embodiment.

In one embodiment, a test system includes a device interface board and tester electronics that control testing operations. The tester electronics can be located in an enclosure which together are referred to as the primitive. The device interface board has a device under test access interface that allows physical manipulation of the devices under test (e.g., manual manipulation, robotic manipulation, etc.). A device under test can be independently manipulated physically with little or no interference or impacts on testing operations of another device under test. Device interface boards and their loadboards can be conveniently setup to accommodate different device form factors. In one embodiment, loadboards are configured with device under test interfaces and universal primitive interfaces. In one exemplary implementation, the device interface board can control an ambient environment of a device under test FIG. 8 is a block diagram of an exemplary test system 800 in accordance with one embodiment. Test system 800 includes a testing primitive 890 (e.g., containing the testing control hardware and power supply components for the devices under test, etc.) and a device interface board (DIB) 810 disposed in front of and coupled to the primitive 890. In one embodiment, the device interface board 810 is a partial enclosure and configured to couple with the test system configuration adapter via tester side socket 820 (similar to 280, 380, 480, 580, etc.) placed in coupling mechanism or component 850. The entire test configuration adapters and DUTs are not shown. The loadboard is also coupled to and electrically interfaces with the primitive 890 to obtain power and high-speed electrical signals for testing the device under test 820. The device interface board can include air flow channels 844 that allow air flow to and from the device under test environment. The air flow channels 844 can include baffles. The device interface board 810 partial enclosure includes a device under test access interface 870 that enables easy physical access (e.g., unobstructed, unimpeded, etc.) to the devices under test. Environmental control components 811 and 814 control and maintain device under test ambient environmental conditions (e.g., temperature, air flow rate, etc.). The environmental control components can create an environmental envelope that prevents or mitigate interference from outside environmental conditions on the operations of devices under test. While access to test system 800 may be easier than test system 700, test system configuration adapters enable both supplemental operations and functional testing that still offers benefits associated with not requiring the expensive and time-consuming multiple moves of DUTs between separate test systems (unlike conventional test approaches).

It is appreciated presented flexible test systems and methods can be utilized to achieve results similar to other testing approaches. A test system configuration adaption system and method can also be utilized to communicate additional or supplemental information to and from devices under test. It is appreciated that various additional or supplemental activities can be implemented via a test system configuration adapter. In one embodiment, breakout pins can be utilized to perform a number of operations. The operations can include low priority activities. The low level priority activities can include collection of information or data from the DUT (e.g., statistics information, status information, information for user understanding of what is happening in the DUT, manufacture specific activities/information, etc.). The supplemental information can be related to device rated capabilities and actual performance. The supplemental information can be associated with SSD DUT (e.g., identify faulty storage cells, bandwidth information, indication of how fast can data be written to and read from portions of the SSD, etc.). The supplemental information can be associated with a display or monitor (e.g., indication of faulty pixels, refresh rate, operating frequency, MIPI compliance, etc.). The supplemental information can be associated with a field programmable gate array (FPGA) device (e.g., FPGA configuration information, operating speed settings, etc.).

The supplemental operations can include low level priority activities associated with configuration operations. A DUT can be set up with a special configuration (e.g., establishing particular zone spaces, namespaces, correlating physical components to virtual components/features, etc.). The configuration can be accomplished without reliance on or interference with primary functional testing (e.g. offline, uploading sequential function information to the DUT, before primary testing on the DUT is initiated, during pauses in the primary functional testing, etc.). Components or portions of a DUT can be turned on or off.

Thus, embodiments of the present invention can facilitate efficient and effective testing with convenient multiple different types of testing procedures on devices under test in a single test system. Allows flexible configuration of pins on the fly to efficiently permit additional/enhanced test/supplemental operation/debug related exchanges. Compresses overall test time which reduces cost and allows faster delivery of tested/debugged products to customers. The adapter makes signal I/O much easier during testing by making certain signal pins physically accessible for monitoring or for signal introduction on the fly. In one embodiment, flexible testing systems and methods do not need separate/dedicated test equipment to perform supplemental operations (e.g., link quality testing, supplemental operations testing, etc.) and functional testing. In one exemplary implementation, a test system can readily support multiple different types of testing by convenient switching between supplemental operations and functional testing without altering other testing electronic components (e.g., primitives, other device interface boards, etc.). Overall testing can be performed faster and overall customer costs are reduced. In one embodiment, there is a reduction in costs are associated with 1) loading and unloading from pre-screen supplemental operations dedicated machines; 2) supplying/maintaining dedicated supplemental operations equipment; and 3) providing factory floor space for dedicated supplemental operations equipment.

Some portions of the detailed descriptions are presented in terms of procedures, logic blocks, processing, and other symbolic representations of operations on data bits within a computer memory. These descriptions and representations are the means generally used by those skilled in data processing arts to effectively convey the substance of their work to others skilled in the art. A procedure, logic block, process, etc., is here, and generally, conceived to be a self-consistent sequence of steps or instructions leading to a desired result. The steps include physical manipulations of physical quantities. Usually, though not necessarily, these quantities take the form of electrical, magnetic, optical, or quantum signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are associated with the appropriate physical quantities and are merely convenient labels applied to these quantities. Unless specifically stated otherwise as apparent from the following discussions, it is appreciated that throughout the present application, discussions utilizing terms such as "processing", "computing", "calculating", "determining", "displaying" or the like, refer to the action and processes of a computer system, or similar processing device (e.g., an electrical, optical, or quantum, computing device), that manipulates and transforms data represented as physical (e.g., electronic) quantities. The terms refer to actions and processes of the processing devices that manipulate or transform physical quantities within a computer system's component (e.g., registers, memories, other such information storage, transmission or display devices, etc.) into other data similarly represented as physical quantities within other components.

It is appreciated that embodiments of the present invention can be compatible and implemented with a variety of different types of tangible memory or storage (e.g., RAM, DRAM, flash, hard drive, CD, DVD, etc.). The memory or storage, while able to be changed or rewritten, can be considered a non-transitory storage medium. By indicating a non-transitory storage medium it is not intend to limit characteristics of the medium, and can include a variety of storage mediums (e.g., programmable, erasable, nonprogrammable, read/write, read only, etc.) and "non-transitory" computer-readable media comprises all computer-readable media, with the sole exception being a transitory, propagating signal.

It is appreciated that the following is a listing of exemplary concepts or embodiments associated with the novel approach. It is also appreciated that the listing is not exhaustive and does not necessarily include all possible implementation. The following concepts and embodiments can be implemented in hardware. In one embodiment, the following methods or process describe operations performed by various processing components or units. In one exemplary implementation, instructions, or directions associated with the methods, processes, operations etc. can be stored in a memory and cause a processor to implement the operations, functions, actions, etc.

It is appreciated that a memory storage management systems and methods can include the following exemplary concepts or embodiments. It is also appreciated that the listing is not exhaustive and does not necessarily include all possible implementations. The following concepts and embodiments can be implemented in hardware, firmware, software, and so on. In one embodiment, the following concepts include methods or processes that describe operations performed by various processing components or units. In one exemplary implementation, instructions or directions associated with the methods, processes, operations etc. can be stored in a memory and cause a processor to implement the operations, functions, actions, etc.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents. The listing of steps within method claims do not imply any particular order to performing the steps, unless explicitly stated in the claim.

What is claimed is:

1. A test system configuration adapter comprising:
   a tester side socket configured to couple with a test equipment socket via a load board;
   a break out pin configured to couple with supplemental equipment, the breakout pin is separate from the load board and wherein coupling of the break out pin to the supplemental equipment is separate from the load board coupling to the test equipment socket; and
   a device under test side slot configured to couple with the tester side socket, the break out pin, and a device under test;
   wherein the test system configuration adapter is configured to enable communication between the device under test and test equipment coupled to the test equipment socket and the supplemental equipment coupled to the breakout pin, wherein coupling of the supplemental system to the device under test is separate from the load board, wherein the device under test remains coupled to the device under test side slot during the communication.

2. The test system configuration adapter of claim 1 wherein the breakout pin and tester side socket are selectively coupled to the device under test side slot.

3. The test system configuration adapter of claim 1 further comprising a switch configured to switch a portion of the coupling of the device under test side slot to the tester side socket and the break out pin.

4. The test system configuration adapter of claim 3 further comprising a controller configured to direct the switch and selection of coupling between supplemental operations and primary functional testing for the device under test.

5. The test system of claim 4, wherein the primary functional testing comprises scan testing.

6. The test system of claim 1, wherein the supplemental equipment is included in the test equipment.

7. The test system of claim 1, wherein supplemental operations are performed on the device under test during pauses in the functional testing from the device under test perspective.

8. A test system comprising:
a load board configured to couple with a device under test;
a tester configured to direct testing of the device under test, wherein the tester is communicatively coupled to the load board; wherein the tester selectively performs primary functional testing on the device under test, and the device under test remains communicatively coupled to the load board during and between performance of supplemental operations and the primary functional testing on the device under test supplemental equipment; and
a test system configuration adapter configured to communicatively couple with a device under test, wherein the test system configuration adapter comprises:
a tester side socket coupled with a test equipment socket via the load board of the tester side socket;
a break out pin configured to couple with supplemental equipment,
wherein the break out pin is separate from the load board and wherein coupling of the break out pin to the supplemental equipment is separate from the load board coupling to the test equipment socket; and
a device under test side slot configured to couple with the tester side socket, the break out pin, and the device under test;
wherein the test system configuration adapter is configured to enable communication between the device under test and the test equipment coupled to the test equipment socket and the supplemental equipment coupled to the breakout pin, wherein the supplemental equipment is coupled to the device under test separate from the load board, wherein the device under test remains coupled to the device under test side slot during the communication.

9. The test system of claim 8, wherein the supplemental operations are performed during pauses in the primary functional testing from a perspective of the device under test.

10. The test system of claim 8, wherein the test system configuration adapter comprises a switch configured to selectively couple the supplemental equipment and the tester to the device under test.

11. The test system of claim 8, wherein the supplemental operations comprise information gathering.

12. The test system of claim 8, wherein the supplemental operations comprise device under test configuration.

13. The test system of claim 8, wherein the tester comprises a Field Programmable Gate Array (FPGA).

14. The test system of claim 8, wherein the testing of the device under test comprises:
selecting a first type of procedure, wherein the first type of procedure comprises the primary functional test;
performing the first type of testing procedure on the device under test;
selecting a second type of procedure, wherein the second type of procedure incudes the supplemental operations; and
performing the second type of testing procedure on the device under test, wherein the device under test remains coupled to the test system throughout the respective, selecting the first type of testing procedure, the performing the first type of testing procedure, the selecting the second type of testing, and the performing the second type of testing procedure.

15. The test system of claim 14, wherein the supplemental operations are performed during pauses in the functional testing from the device under test perspective.

16. The test system of claim 14, wherein the selecting the first type of procedure, the performing the first type of procedure, the selecting the second type of procedure, and the performing the second type of procedure are automatic.

17. The test system of claim 14, wherein the tester is further configured to direct testing of another device under test and the testing of the other device under test comprises:
switching to the other device under test;
selecting the first type of procedure for the other device under test, wherein the first type of procedure comprises the first functional test;
performing the second type of testing procedure on the other device under test;
selecting the second type of procedure for the other device under test, wherein the second type of procedure incudes the second supplemental operation; and
performing the second type of testing procedure on the other device under test, wherein other devices under test remain coupled to the test system throughout the testing procedures comprising the selecting the first type of testing procedure for the other device under test, the performing the first type of testing procedure on the other device under test, the selecting the second type of testing for the device under test, and the performing the second type of testing procedure on the other device under test.

* * * * *